US008642896B2

(12) United States Patent
Fukuzono

(10) Patent No.: US 8,642,896 B2
(45) Date of Patent: Feb. 4, 2014

(54) PRINTED CIRCUIT BOARD, PRINTED CIRCUIT BOARD FABRICATION METHOD, AND ELECTRONIC DEVICE INCLUDING PRINTED CIRCUIT BOARD

(75) Inventor: Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 12/817,562

(22) Filed: Jun. 17, 2010

(65) Prior Publication Data

US 2010/0326714 A1    Dec. 30, 2010

(30) Foreign Application Priority Data

Jun. 24, 2009 (JP) ................................. 2009-149528

(51) Int. Cl.
H05K 1/16    (2006.01)
(52) U.S. Cl.
USPC ........................................................ 174/260
(58) Field of Classification Search
None
See application file for complete search history.

(56) References Cited

U.S. PATENT DOCUMENTS

| 5,124,884 | A  | * | 6/1992  | Yazu et al. ................... | 361/705 |
| 5,900,675 | A  | * | 5/1999  | Appelt et al. ................. | 257/778 |
| 6,156,980 | A  | * | 12/2000 | Peugh et al. ................... | 174/252 |
| 6,297,959 | B1 | * | 10/2001 | Ueno et al. ..................... | 361/704 |
| 6,545,351 | B1 | * | 4/2003  | Jamieson et al. ............. | 257/712 |
| 6,744,135 | B2 | * | 6/2004  | Hasebe et al. ................. | 257/712 |
| 7,038,142 | B2 | * | 5/2006  | Abe .............................. | 174/255 |
| 7,291,901 | B2 | * | 11/2007 | Koide et al. ................... | 257/678 |
| 7,730,613 | B2 | * | 6/2010  | Vasoya .......................... | 29/852 |
| 2002/0189853 | A1 | * | 12/2002 | Hsu ................................. | 174/252 |
| 2004/0165354 | A1 | * | 8/2004  | Mochizuki et al. ............ | 361/705 |
| 2005/0180111 | A1 | * | 8/2005  | Bamesberger et al. ........ | 361/704 |
| 2007/0063324 | A1 |   | 3/2007  | Mishiro |  |
| 2007/0095471 | A1 | * | 5/2007  | Ito et al. ........................ | 156/293 |
| 2008/0251285 | A1 | * | 10/2008 | Sato et al. ..................... | 174/260 |

FOREIGN PATENT DOCUMENTS

| JP | 1-291438       | 11/1989 |
| JP | 04-213863      | 8/1992  |
| JP | 2005-251792    | 9/2005  |
| JP | 2006-108460 A1 | 4/2006  |
| JP | 2007-88293 A1  | 4/2007  |
| JP | 2008-130618    | 6/2008  |
| JP | 2009-33100     | 2/2009  |

OTHER PUBLICATIONS

Japanese Office Action mailed Mar. 12, 2013, with English translation, in counterpart Japanese Application No. 2009-149528.
Japanese Office Action issued for Japanese Patent Application No. 2009-149528 dated Oct. 29, 2013, with English translation.

* cited by examiner

*Primary Examiner* — Ishwarbhai Patel
(74) *Attorney, Agent, or Firm* — Kratz, Quintos & Hanson, LLP

(57) ABSTRACT

A printed circuit board include: a printed circuit board main body having a mounting area on a first surface of the printed circuit board main body and a recess being provided at a recess area on a second surface that is a back side of the first surface of the printed circuit board main body, the electronic component being mounted on the mounting area, the recess area being provided to correspond to the mounting area; and a thermal expansion control element being placed in the recess and having a smaller thermal expansion coefficient than the printed circuit board main body.

7 Claims, 6 Drawing Sheets

Expansion by heating

Displacement due to difference between the thermal expansion coefficients

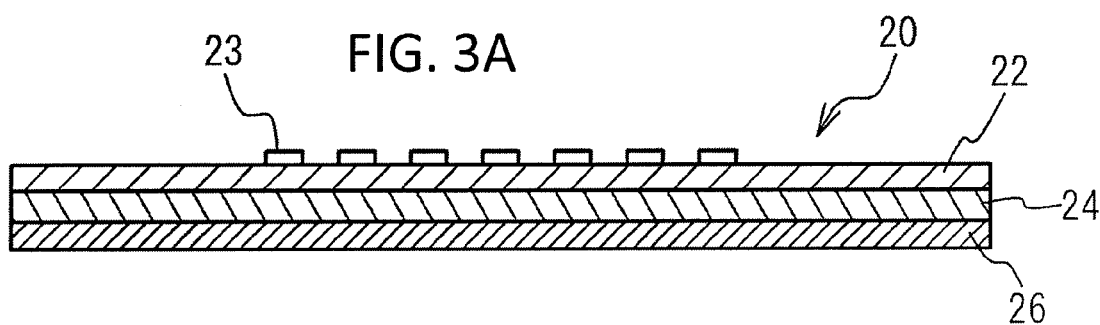
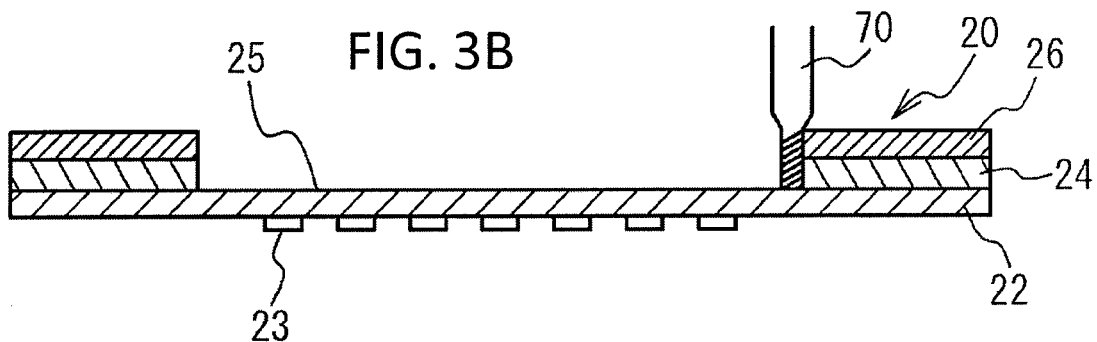
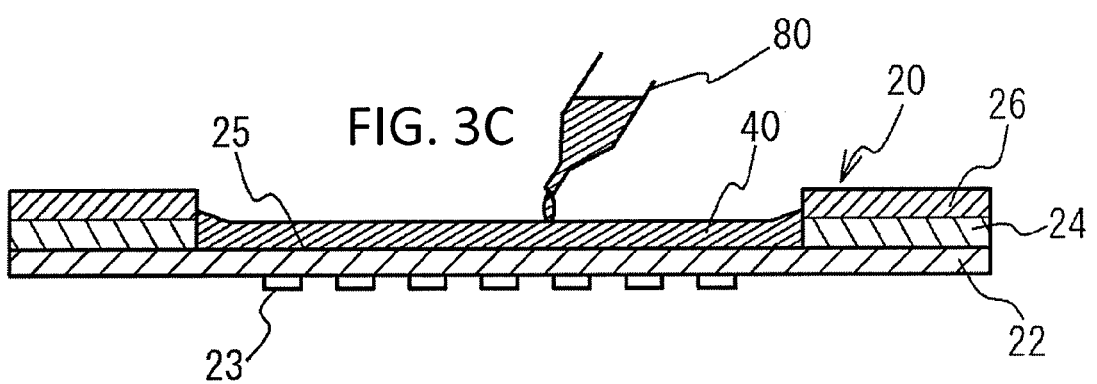
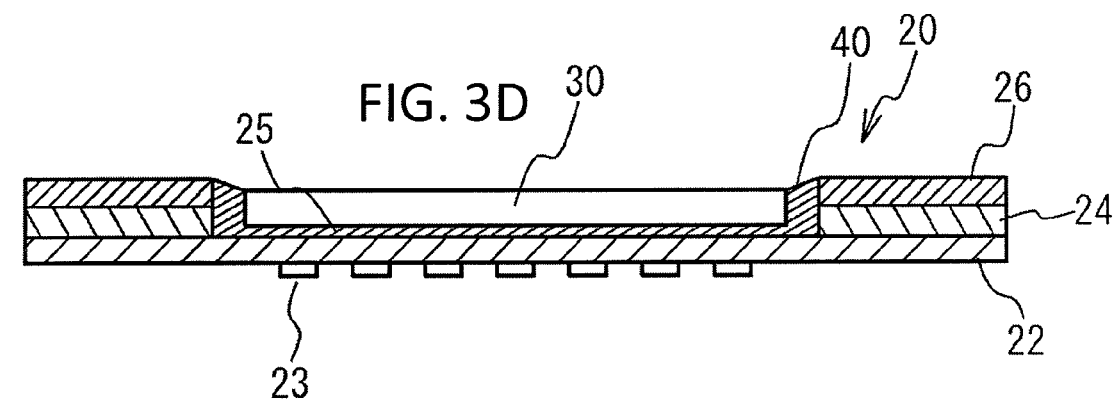

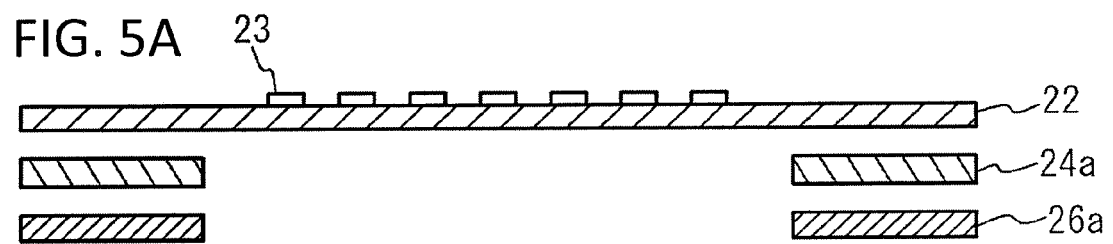
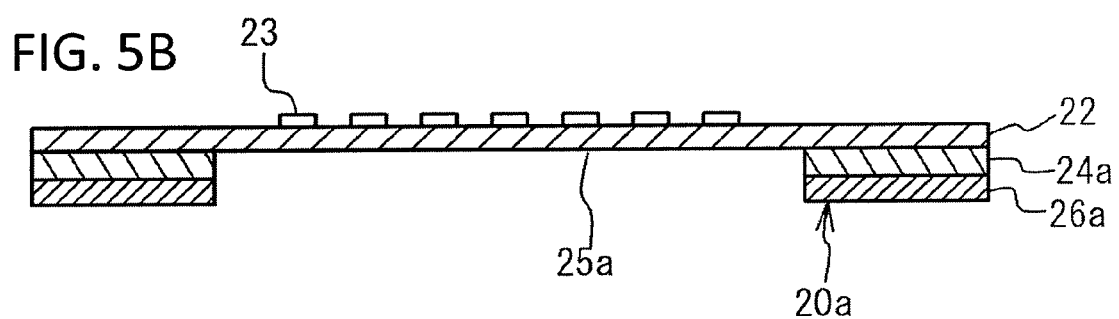
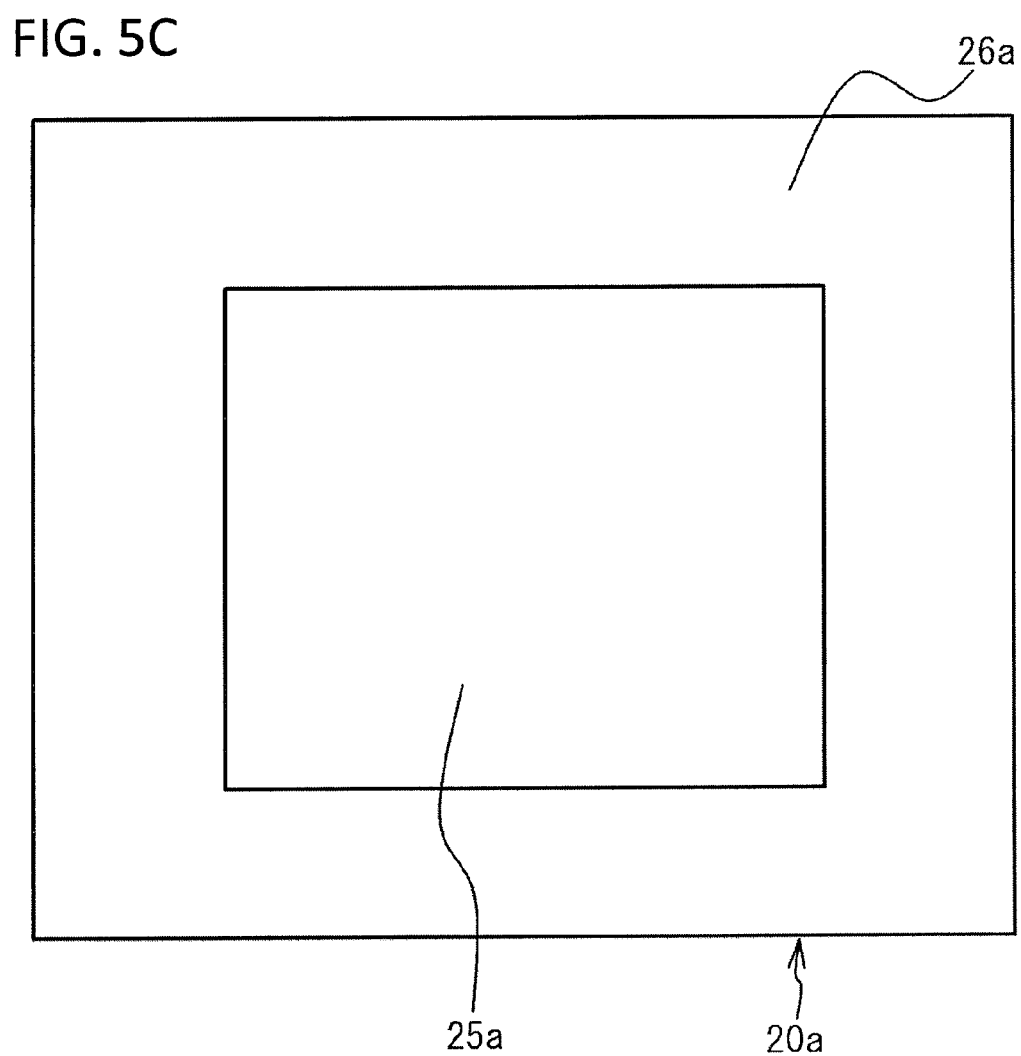

PRINTED CIRCUIT BOARD, PRINTED CIRCUIT BOARD FABRICATION METHOD, AND ELECTRONIC DEVICE INCLUDING PRINTED CIRCUIT BOARD

CROSS REFERENCE TO RELATED APPLICATION

This application is based upon and claims the benefit of priority from the prior Japanese Patent Application No. 2009-149528 filed on Jun. 24, 2009, the entire contents of which are incorporated herein by reference.

FIELD

The embodiments discussed herein are related to a printed circuit board, a printed circuit board fabrication method, and an electronic device including a printed circuit board.

BACKGROUND

There are techniques for reducing warpage of printed circuit boards (PCBs). Japanese Laid-Open Patent Publication No. 2006-108460 discloses a technique in which elastic strips are embedded in a PCB to absorb warpage of the PCB. Japanese Laid-Open Patent Publication No. 2007-88293 discloses a technique in which elements having substantially the same dimensions as electronic components are provided on the back side of a PCB on which the electronic components are mounted to reduce warpage of the PCB.
[Patent Document 1]
Japanese Laid-Open Patent Publication No. 2006-108460
[Patent Document 2]
Japanese Laid-Open Patent Publication No. 2007-88293
[Patent Document 3]
Japanese Laid-Open Patent Publication No. 1-291438

The mechanism of how a PCB is warped will be described. Electrodes $13x$ of an electronic component $10x$ which are made of solder are arranged on terminals $23x$ of a PCB $20x$ as illustrated in FIG. 1A. Then, the electronic component $10x$ and the PCB $20x$ are heated to melt the electrodes $13x$ to join the electrodes $13x$ to the terminals $23x$. If the difference between the thermal expansion coefficients of the PCB $20x$ and that of the electronic component $10x$ is large, for example 10 ppm/K or larger, the electrodes $13x$ and the terminals $23x$ are displaced with respect to each other due to the heating, as depicted in FIG. 1B. The amount of the displacement increases with the distance from the center of the electronic component $10x$. Accordingly, the larger the electronic component $10x$ in size in the planer direction, the larger the amount of the displacement of the outermost electrode $13x$ and the terminal $23x$ with respect to each other is. After completion of the heating process, the PCB $20x$ tends to drastically contract with respect to the electronic component $10x$. However, the mounting surface side of the PCB $20x$ resists contracting because the electrodes $13x$ and the terminals $23x$ are joined together. On the other hand, the back side of the PCB $20x$ on which no electronic component $10x$ is mounted tends to contract to the original size. Consequently, the PCB $20x$ warps as depicted in FIG. 1C due to the difference in the amount of contraction between the mounting surface side and back side of the PCB $20x$.

As has been described above, one cause of the warpage of a PCB is the difference in thermal expansion rate between electronic components and the PCB. The techniques disclosed in Japanese Laid-Open Patent Publications No. 2006-108460 and No. 2007-88293 attempt to reduce warpage caused by the difference in thermal expansion rate between electronic components and the PCB by increasing stiffness of the PCB or to absorb distortion caused by warpage by using a different material. However, neither of the Japanese Laid-Open Patent Publications discloses control of the differential thermal expansion of electronic components and the PCB, which is the root cause of warpage of the PCB.

SUMMARY

From one aspect of embodiments, a printed circuit board disclosed herein includes: a printed circuit board main body having a mounting area in which a surface-mount electronic component is to be mounted and a recess at the back side of the mounting area; and a thermal expansion control element placed in the recess and having a smaller thermal expansion coefficient than the printed circuit board main body.

From another aspect of embodiments, a print circuit board fabrication method disclosed herein includes: providing a printed circuit board main body on which a surface-mount electronic component is to be mounted; forming a recess at the back side of an mounting area of the printed circuit board main body; and placing a thermal expansion control element having a smaller thermal expansion coefficient than the printed circuit board main body in the recess.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIGS. 3A to 3D are diagrams illustrating a PCB fabrication method;

FIGS. 5A to 5C are diagrams illustrating a first variation of the PCB fabrication method.

DESCRIPTION OF EMBODIMENTS

An electronic device according to an exemplary embodiment of the present invention will be described.

Figure 1A:
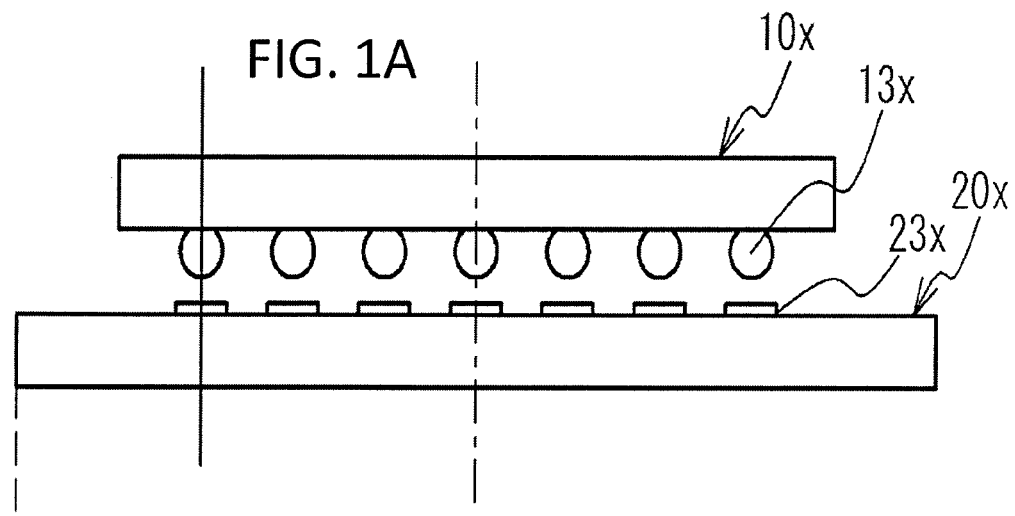
FIGS. 1A to 1C are diagrams illustrating a mechanism of how a PCB is warped.
Figure 1B:
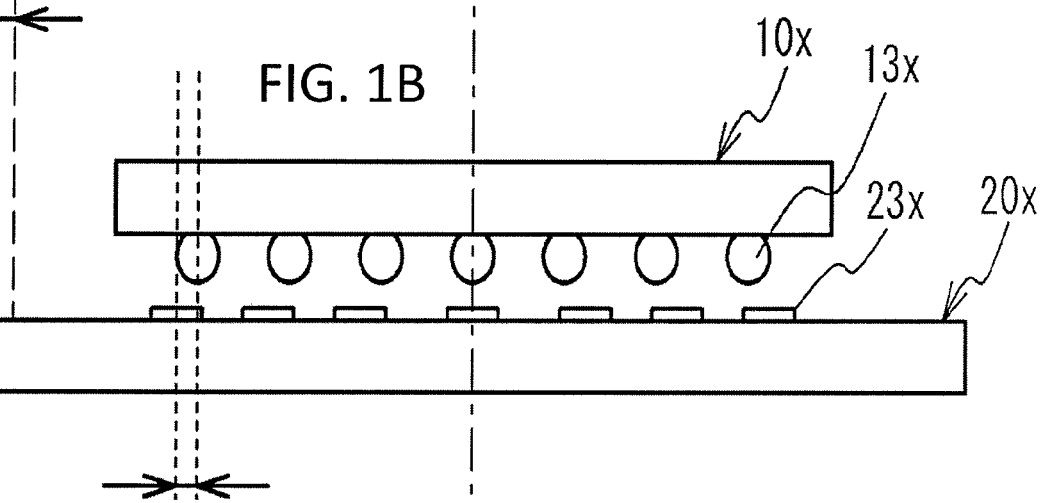
Figure 1C:
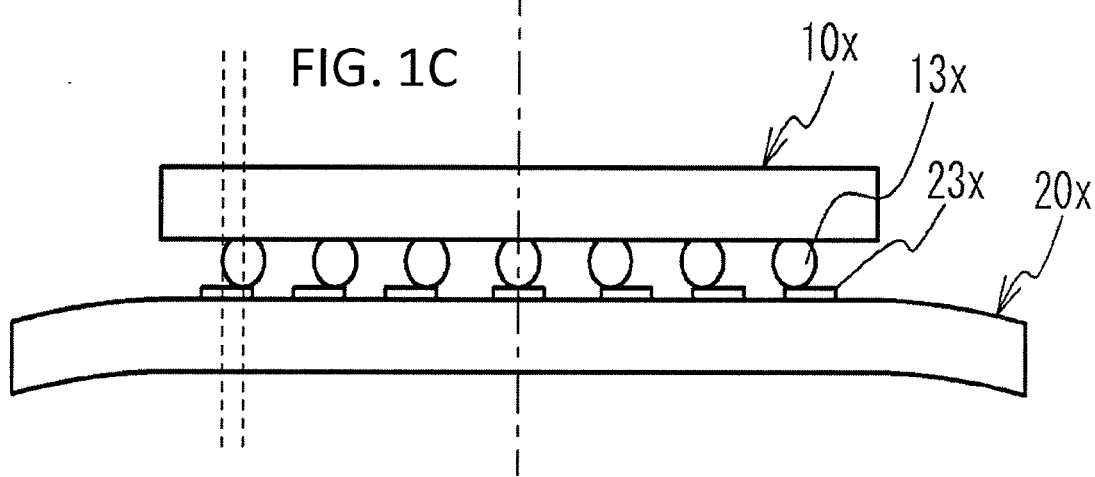
Figure 2A:
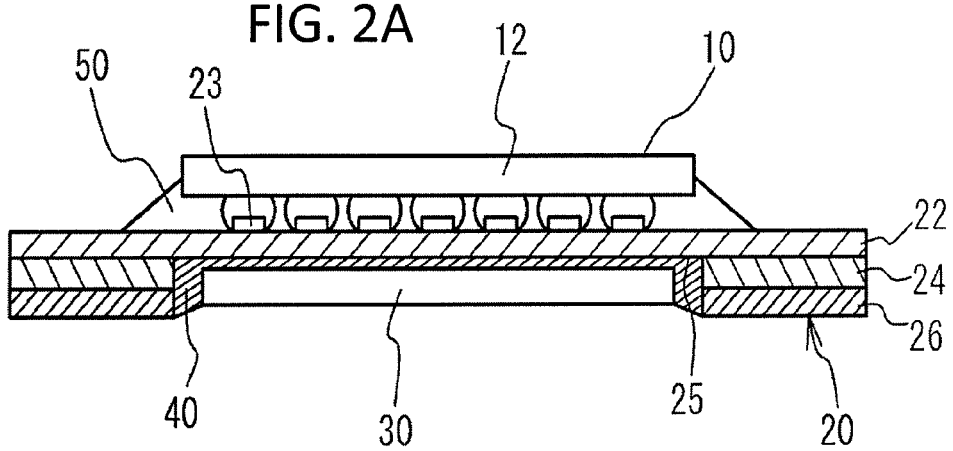
FIG. 2A is a diagram illustrating an electronic device according to an exemplary embodiment of the present invention and FIG. 2B is an enlarged sectional view of a portion of the electronic device according to the exemplary embodiment.

FIG. 2A is a diagram illustrating an electronic device according to an exemplary embodiment. As illustrated in FIG. 2A, the electronic device according to the exemplary embodiment includes an electronic component 10 and a printed circuit board (PCB) 20 on which the electronic component 10 is mounted. The electronic component 10 is of a surface-mount type and, in particular, a ball-grid-array (BGA) type. The electronic component 10 includes an electronic component main body 12 and multiple electrodes 13 provided on the bottom surface of the electronic component main body 12. The electrodes 13 are made of solder. The electronic component 10 includes a resin-encapsulated semiconductor chip and a chip package substrate on which the semiconductor chip is fixed, not depicted in particular. The electrodes 13 are provided on the chip package substrate.

The PCB 20 includes a core layer 24 and interconnection layers 22 and 26 provided on the surfaces of the core layer 24. Each of the interconnection layers 22 and 26 includes multiple insulating layers and interconnection patterns provided on the insulating layers. Multiple terminals 23 are formed on the top surface of the interconnection layer 22. The terminals 23 are connected to the electrodes 13 of the electronic component 10. The electrodes 13 and terminals 23 are encapsulated with underfill material 50. The area on the PCB 20 in which the multiple terminals 23 are formed is the mounting area in which the electronic component 10 is mounted. A recess 25 is provided in the back surface of the mounting area on which the electronic component 10 is mounted. The recess 25 contains a low-expansion element 30 for matching the thermal expansion coefficient of the PCB 20 to that of the electronic component 10. The low-expansion element 30 is fixed in the recess 25 with an insulating adhesive 40. The low-expansion element 30 is a thin plate made of a metal having a small thermal expansion rate. The low-expansion element 30 constitutes a thermal expansion control element in the present invention. The thermal expansion coefficient of the low-expansion element 30 is lower than those of the interconnection layers 22 and 26 and the core layer 24, which will be detailed later.

Figure 2B:
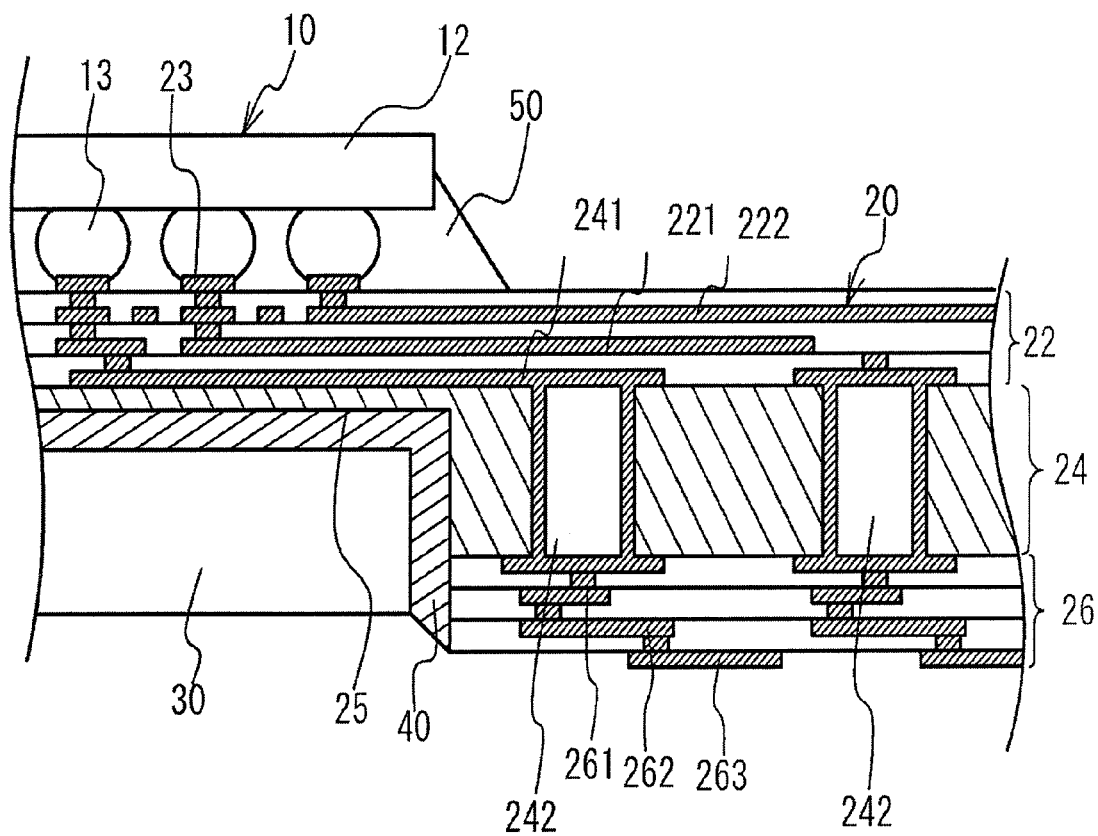

FIG. 2B is an enlarged view of a portion of the electronic device according to the present exemplary embodiment.

As illustrated in FIG. 2B, the terminals 23 are electrically connected to patterns 221, 222 formed in the layers of the interconnection layer 22 and a pattern 241 formed on the surface of the core layer 24. Through holes 242 are formed in the core layer 24. The through holes 242 are electrically connected to patterns 261, 262 formed in the layers of the interconnection layer 26. That is, the interconnection patterns of the interconnection layer 22 and the interconnection patterns of the interconnection layer 26 are electrically interconnected through the core layer 24. As depicted in FIG. 2B, the through holes 242 are disposed outside the recess 25 and the patterns formed in the layers skirt around the recess 25. The patterns provided in the layers are electrically interconnected through a conductive paste.

A PCB fabrication method will be described below.

FIGS. 3A to 3D illustrate a method for fabricating a PCB 20. As depicted in FIG. 3A, a PCB 20 in which a recess 25 is yet to be formed is fabricated. In the PCB 20, interconnection patterns are provided in such a manner that the interconnection patterns skirt around a region where a recess 25 is to be formed, as depicted in FIG. 2B. The PCB 20 itself may be a multilayer PCB or a single-sided PCB or a double-sided PCB as depicted in FIG. 2B.

As depicted in FIG. 3B, a portion of a core layer 24 and an interconnection layer 26 at the back side of the mounting surface of the PCB 20 is cut away with a drill 70. The drill 70 may be one used for forming a through-hole in PCBs, for example. A back side portion corresponding to the mounting area is cut away with the drill 70. As a result, a PCB having a recess 25 is formed. The interconnection layer 22 is not cut. While a portion of the core layer 24 and the interconnection layer 26 is cut away with the drill 70 in FIG. 3B, a portion of the interconnection layer 26 alone may be cut away to form a recess 25 at the back of the mounting area. The cut-away area is determined with respect to alignment marks provided in the interconnection layer 26 beforehand.

Then, an adhesive 40 is applied to the inside of the recess 25 as depicted in FIG. 3C by using a nozzle 80. The adhesive 40 is an insulating liquid adhesive. The adhesive 40 may be a cold-setting resin or a thermosetting resin.

Then, a low-expansion element 30 is placed in the recess 25. If the adhesive 40 is cold-setting, the low-expansion element 30 is placed in the recess 25 and left standing until the low-expansion element 30 is fixed in the recess 25. If the adhesive 40 is thermosetting, the PCB 20 is placed in a reflow oven or the like to thermally cure the adhesive 40. As a result, the low-expansion element 30 is embedded in the recess 25.

An electronic component 10 is mounted onto the PCB 20 thus fabricated. The electronic component 10 is mounted onto the PCB 20 by heating in a reflow oven.

As has been described earlier, the low-expansion element 30 has a smaller thermal expansion coefficient than the interconnection layer 22, the core layer 24, and the interconnection layer 26. Typically, the interconnection layers 22 and 26 have a thermal expansion coefficient in the range of approximately 20 to 40 ppm/K and the core layer 24 has a thermal expansion coefficient of approximately 12 ppm/K. Accordingly, the thermal expansion coefficient of a typical PCB as a whole is approximately 16 ppm/K, depending on the thicknesses of the interconnection layer 22 and the core layer 24. The thermal expansion coefficient of the electronic component 10 is approximately 3 ppm/K. The low-expansion element 30 may be made of Invar, which is an alloy, having a thermal expansion coefficient in the range of approximately 0.3 to 1.5 ppm/K. The low-expansion element 30 may be made of Kovar, Super Invar, stainless Invar, or Fe—Pd alloy, instead of Invar.

As has been described above, the recess 25 is provided in the PCB 20 and the low-expansion element 30 is embedded in the recess 25. Since the low-expansion element 30 is integrated with the PCB 20, the thermal expansion coefficient of the PCB as a whole is smaller than that of a PCB without the embedded low-expansion element 30. By embedding the low-expansion element having a smaller thermal expansion coefficient than the PCB in this way, the thermal expansion coefficient of the PCB as a whole may be controlled to a small value. As the thermal expansion coefficient of the PCB 20 as a whole is reduced, the difference in thermal expansion coefficient between the electronic component 10 and the PCB 20 is reduced accordingly. Therefore, warpage of the PCB 20 due to differential thermal expansion during heating for mounting the electronic component 10 onto the PCB 20 may be suppressed. Furthermore, since low-expansion element 30 is embedded in the recess 25 provided at the back side of the mounting area on which the electronic component 10 is to be mounted, thermal expansion of the mounting area may be suppressed.

Thermal expansion coefficient of the PCB as a whole with the low-expansion element 30 embedded will be described below.

Figure 4:
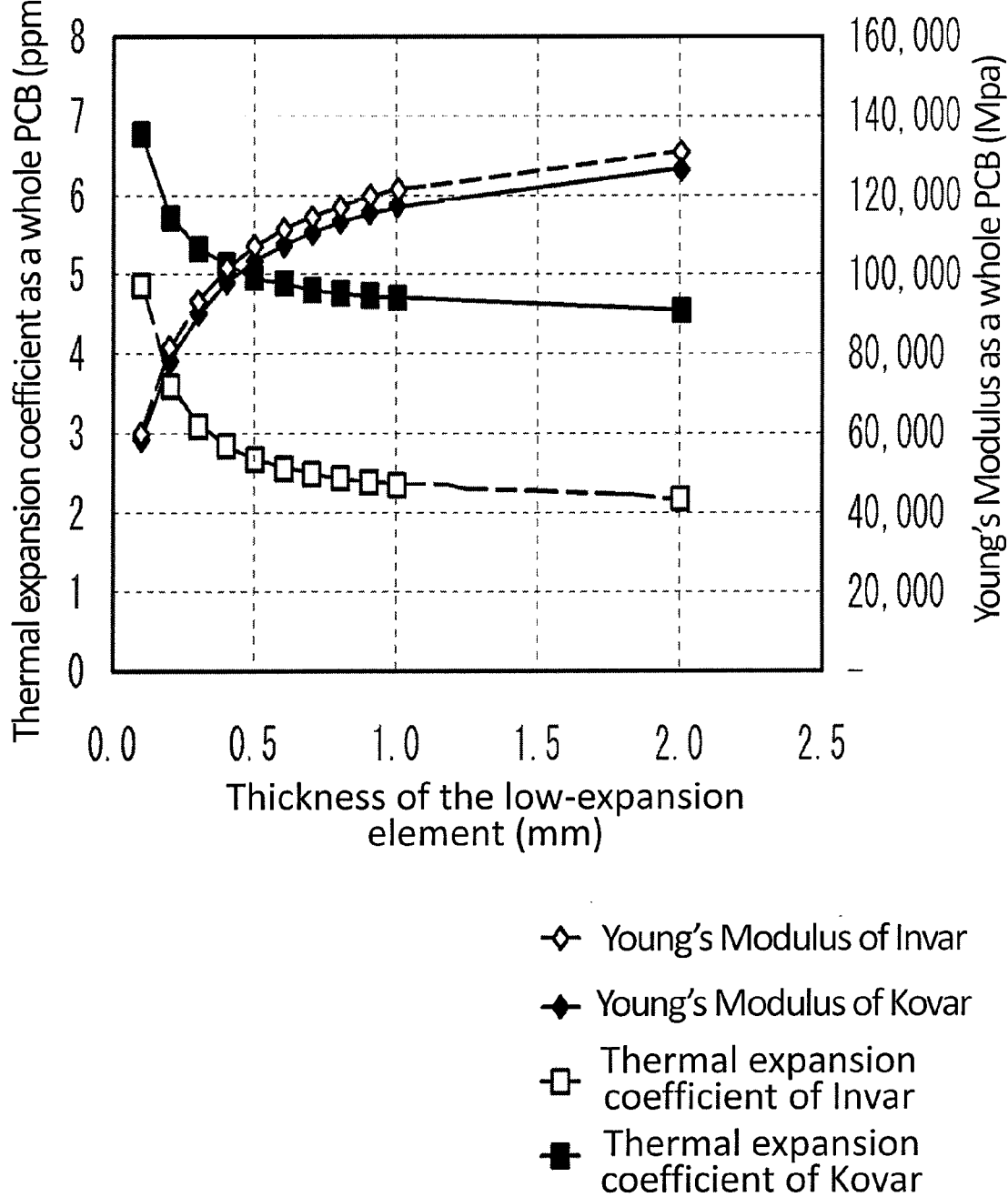
FIG. 4 is a graph illustrating thermal expansion coefficients of PCBs with an integrally embedded low-expansion element.

FIG. 4 is a graph illustrating thermal expansion coefficients of PCBs as a whole with an integrally embedded low-expansion element 30. The vertical axis of the graph in FIG. 4 represents the thermal expansion coefficient (ppm/K) and Young's modulus (Mpa) of the PCB with a low-expansion element 30 integrally embedded in the recess 25. The horizontal axis of the graph represents the thickness (mm) of the low-expansion element. Low-expansion elements made of Invar and low-expansion elements made of Kovar were used to conduct the experiments.

As seen from FIG. 4, the thermal expansion coefficients of the PCBs with the low-expansion element integrally embedded decreases as the thickness of the low-expansion element increases. However, if a thick low-expansion element is used, the surface of the low-expansion element protrudes from the recess 25, increasing the thickness of the PCB as a whole and requiring the depth of the recess 25 to be increased. Therefore, the thickness of the PCB needs to be taken into consideration to choose a low-expansion element. For example, if the electronic component 10 has a thermal expansion coefficient of 3 ppm/K, a low-expansion element made of Invar with a thickness of approximately 0.25 mm is used to make the thermal expansion coefficient of the PCB with the low-expansion element integrally embedded substantially equal to the thermal expansion coefficient of the electronic component 10. Since the difference in thermal expansion coefficient between the PCB and the electronic component 10 is thus substantially eliminated, warpage of the PCB, which would otherwise be caused by differential thermal expansion as described earlier, may be suppressed. The thermal expansion coefficients of semiconductor chips are determined largely by silicon and germanium used.

The low-expansion alloy element 30 embedded in the recess 25 increases the stiffness of the PCB 20 as a whole. A low-expansion element having a height that does not exceed the depth of the recess 25 enables reduction of thickness of the PCB 20 while ensuring the strength of the PCB 20. The recess 25 needs to be provided only in a portion of the area at the back side of the area where the electronic component 10 is to be mounted. Accordingly, the area of the bottom recess 25 may be smaller than or greater than the area of the electronic component 10 mounting area.

A first variation of the method of fabricating a PCB main body will be described below.

FIGS. 5A to 5C illustrate the first variation of the method for fabricating a PCB main body.

As illustrated in FIG. 5A, a core layer 24a and an interconnection layer 26a formed into the shape of frame by hollowing out their central area are stacked on the backside of the mounting surface of an interconnection layer 22 in this order. The core layer 24a and the interconnection layer 26a may be formed simultaneously or in sequence. The layers are stacked so that the hollow portion of the core layer 24a and the interconnection layer 26a are located at the backside of the mounting area of the interconnection layer 22 where an electronic component 10 is to be mounted. As a result, a PCB 20a having a recess 25a at the backside of the mounting area as depicted in FIGS. 5B and 5C may be fabricated. FIG. 5C depicts the PCB 20a viewed from the side on which the recess 25a is formed.

The interconnection layer 22, the core layer 24a and the interconnection layer 26a may be aligned with one another by inserting a common pin into holes that have been formed in the layers beforehand. Alternatively, alignment marks may be provided on the interconnection layer 22, the core layer 24a and the interconnection layer 26a beforehand and the layers may be aligned with one another with respect to the alignment marks by using an X-ray reader.

The core layer 24a and the interconnection layer 26a need to be stacked in such a manner that the core layer 24a and the interconnection layer 26a skirt around at least a portion of the region at the backside of the mounting area of the interconnection layer 22.

A second variation of the PCB fabrication method will be described below.

Figure 6A:
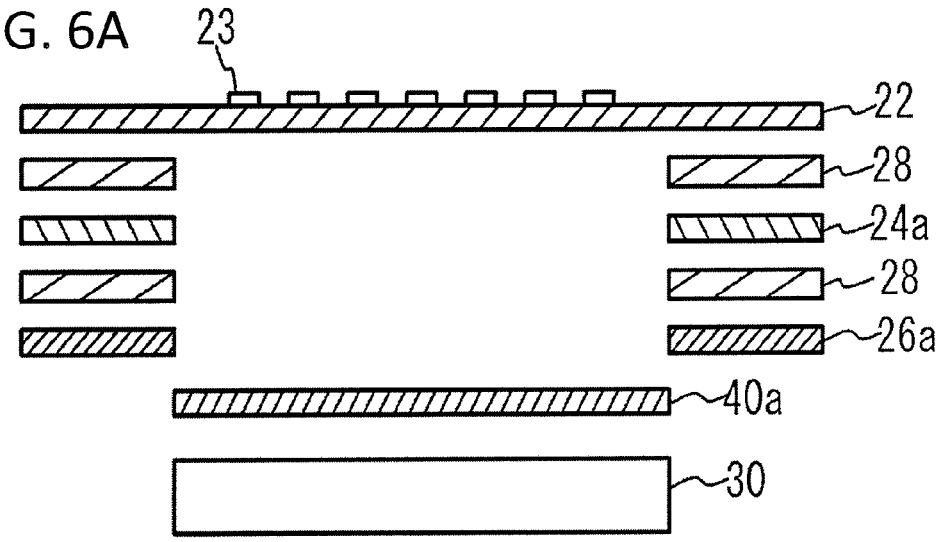
FIGS. 6A to 6C are diagrams illustrating a second variation of the PCB fabrication method.
Figure 6B:
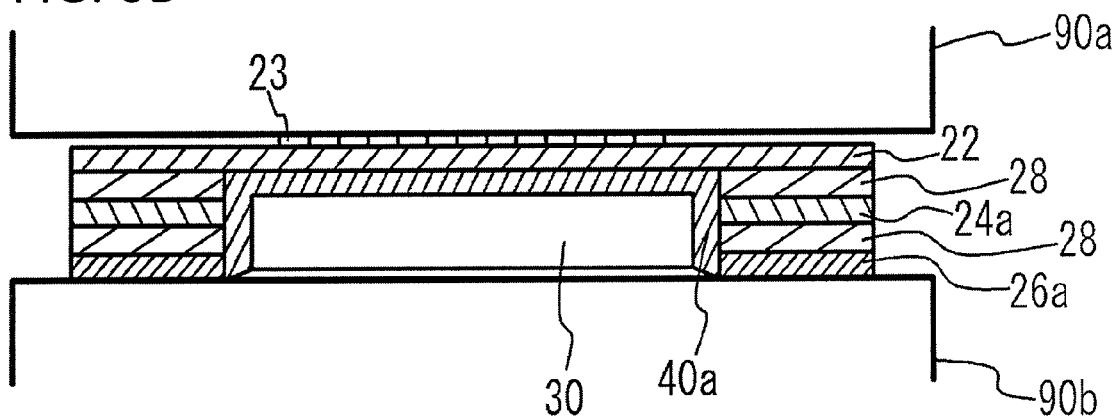
Figure 6C:
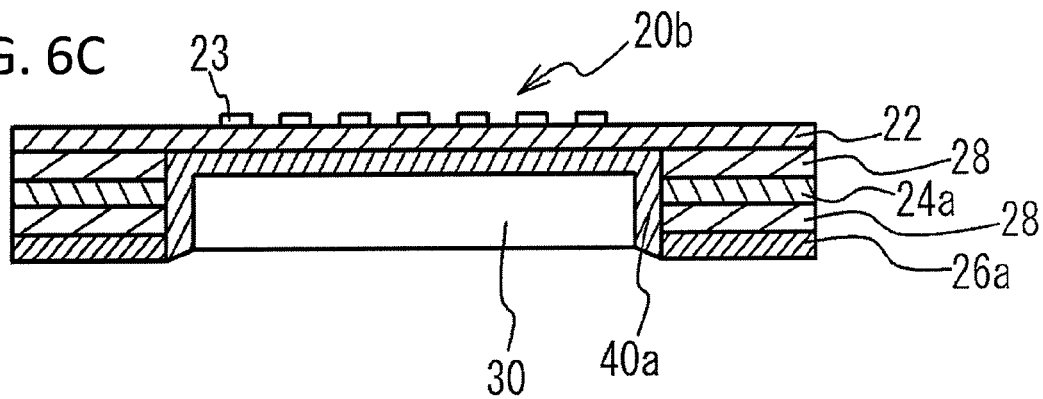

FIGS. 6A to 6C illustrate the second variation of the PCB main body fabrication method. In the fabrication method according to the second variation, a PCB in which a low-expansion element 30 is embedded is fabricated by stacking layers simultaneously.

As illustrated in FIG. 6A, an adhesion layer 28 is disposed between the above-described interconnection layer 22 and the core layer 24a and between the core layer 24a and the interconnection layer 26a. The adhesion layers 28 have substantially the same shape as the core layer 24a and the interconnection layer 26a. That is, the adhesion layers 28 are formed into the shape of a frame by hollowing out their central area. Each of the adhesion layers 28 is a sheet of resin made by impregnating a sheet of glass fabric with the resin and heating the resin-impregnated glass fabric to a partially cured stated. An adhesive 40a and a low-expansion element 30 are stacked on the backside of the mounting area of the interconnection layer 22 in this order. The adhesive 40a is a film of a thermosetting resin.

The interconnection layer 22, the core layer 24a, the interconnection layer 26a, and the adhesion layers 28 during stacking are aligned by inserting a common pin into holes provided in the layers beforehand. Likewise, the interconnection layer 22, the adhesive 40a and the low-expansion element 30 are aligned with one another by inserting a common pin into holes provided in the layers beforehand.

After stacking the layers as described above, the layers are heated and pressed with heat pressing plates 90a and 90b of a heat press machine as depicted in FIG. 6B. As a result, a PCB 20b as depicted in FIG. 6C is fabricated.

Having described preferable embodiments of the present invention, the present invention is not limited to those particular embodiments and various variations and modifications thereof may be made without departing form the spirit or scope of the invention as defined in the claims.

The electronic component described above is not limited to a BGA type electronic component. The electronic component may be any of other types such as QFN (Quad Flat Non-leaded package), TCP (Tape Carrier Package), TSOP (Thin small outline package), SOP (Small Outline Package), QFP (Quad Flat Package), SOJ (Small Outline J-leaded), and QFJ (Quad Flat J-leaded package). That is, the electronic component may be any electronic component that is mounted on the surface of a PCB main body by soldering. While the embodiments have been described with respect to an example in which the electronic component includes a resin-encapsulated semiconductor chip, the present invention is not limited to this. For example, an electronic component including a semiconductor chip covered with a metal cover may be used, instead of a resin-encapsulated chip.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed circuit board comprising:
   a surface-mount type electronic component including a terminal array on one surface thereof;
   a printed circuit board main body having a mounting area on a first surface of the printed circuit board main body and a recess being provided at a recess area on a second surface that is a back side of the first surface of the printed circuit board main body, part of the printed circuit board main body being between the first surface and bottom of the recess, the terminal array of the electronic component being mounted on the printed circuit board in contact with the mounting area, the recess area being provided to correspond to the mounting area; and a thermal expansion control element being placed in the recess and having a smaller thermal expansion coefficient than the printed circuit board main body, wherein an insulating adhesive is applied onto a sidewall of the recess and the bottom of the recess so as to cover an inner wall of the recess, and the thermal expansion control element is fixed in the recess with the insulating adhesive to electrically insulate the thermal expansion control element from the electronic component.

2. The printed circuit board according to claim 1, wherein the insulating adhesive is a thermosetting resin.

3. The printed circuit board according to claim 1, wherein the thermal expansion control element is made of a material selected from the group consisting of Invar, Kovar, Super Invar, stainless Invar, and a Fe—Pd alloy.

4. The printed circuit board according to claim 1, wherein the printed circuit board main body comprises a core layer and first and second interconnection layers sandwiching the core layer, and the recess is an opening at the back side of the mounting area and is formed at least in the second interconnection layer.

5. The printed circuit board according to claim 1, wherein the terminal array is a ball-grid array.

6. A printed circuit board, comprising:

a surface-mount type electronic component including a terminal array on one surface thereof;

a printed circuit board main body having a mounting area on a first surface of the printed circuit board main body and a recess being provided at a recess area on a second surface that is a back side of the first surface of the printed circuit board main body, the terminal array of the electronic component being mounted on the printed circuit board in contact with the mounting area, the recess area being provided to correspond to the mounting area, wherein the printed circuit board, having the main body with the recess area, is contiguous in its entirety; and a thermal expansion control element being placed in the recess and having a smaller thermal expansion coefficient than the printed circuit board main body, wherein an insulating adhesive is applied onto a sidewall of the recess and the bottom of the recess so as to cover an inner wall of the recess, and the thermal expansion control element is fixed in the recess with the insulating adhesive to insulate the thermal expansion control element from the electronic component.

7. The printed circuit board according to claim 6, wherein the terminal array is a ball-grid array.

* * * * *